United States Patent
Besinger et al.

(10) Patent No.: US 7,569,505 B2
(45) Date of Patent: Aug. 4, 2009

(54) METHOD FOR PRODUCING AN ELECTRONIC COMPONENT PASSIVATED BY LEAD FREE GLASS

(75) Inventors: Joern Besinger, Landshut (DE); Oliver Fritz, Landshut (DE); Peter Brix, Mainz (DE)

(73) Assignee: Schott AG, Mainz (DE)

(*) Notice: Subject to any disclaimer, the term of this patent is extended or adjusted under 35 U.S.C. 154(b) by 455 days.

(21) Appl. No.: 11/475,476

(22) Filed: Jun. 27, 2006

(65) Prior Publication Data

US 2007/0009744 A1    Jan. 11, 2007

(30) Foreign Application Priority Data

Jul. 5, 2005    (DE) .................. 10 2005 031 658

(51) Int. Cl.
*C03C 3/068* (2006.01)
*C03C 3/066* (2006.01)
*C03C 8/02* (2006.01)
*B28B 1/14* (2006.01)
*C23C 24/00* (2006.01)

(52) U.S. Cl. .................. 501/79; 501/21; 501/78; 427/96.2; 427/126.2; 427/383.5

(58) Field of Classification Search .............. 501/21, 501/78, 79; 428/426; 427/96.2, 126.2, 383.5
See application file for complete search history.

(56) References Cited

U.S. PATENT DOCUMENTS

| | | | |
|---|---|---|---|
| 3,113,878 A | 12/1963 | Martin | |
| 4,312,951 A | 1/1982 | Eppler | |
| 4,772,574 A * | 9/1988 | Hang et al. | 501/21 |
| 6,475,605 B2 * | 11/2002 | Hayakawa et al. | 428/210 |
| 2003/0078154 A1 | 4/2003 | Brix et al. | |
| 2003/0228471 A1 | 12/2003 | Hayakawa et al. | |
| 2008/0161178 A1 * | 7/2008 | Besinger et al. | 501/79 |

FOREIGN PATENT DOCUMENTS

| | | |
|---|---|---|
| EP | 0 025 187 | 3/1981 |
| EP | 0 091 909 | 10/1983 |
| JP | 2002-308645 | 10/2002 |

OTHER PUBLICATIONS

M. Shimbo, and K. Furukawa. "Physical and Electrical Properties of Acid Resistive Zinc-Lead Borosilcate Passivation Glass." J. Ceram. Soc Jpn. Inter. Ed. vol. 96 (1988) pp. 201-205.

* cited by examiner

*Primary Examiner*—Karl E Group
*Assistant Examiner*—Elizabeth A Bolden
(74) *Attorney, Agent, or Firm*—Michael J. Striker

(57) ABSTRACT

The invention relates to a method for the production of glass-coated electric components, wherein the components are, inter alia, passivated by the application of the glass. The lead-free glass used is not affected through purification and processing steps and the electric component is protected from mechanical damaging and other detrimental influences, such as impurities. Further, the method remarkably helps to stabilize the electrical properties of the components. Inter alia, a sufficient acid resistance is achieved and it results in an improvement of the expansion adjustment of the glass.

25 Claims, No Drawings

METHOD FOR PRODUCING AN ELECTRONIC COMPONENT PASSIVATED BY LEAD FREE GLASS

BACKGROUND OF THE INVENTION

The invention relates to a method for the production of glass-coated electronic components and the use of said method for the passivation of electronic components.

Electronic components store, consume or transfer electrical net power, inter alia as passive components, such as electrical resistances, capacitors or also coils. On the other hand, active electronic components are components which can add electrical net power to a signal. Active components are in particular semiconductors, such as diodes.

Diodes are semiconductor components in the field of electronics, characterised by their asymmetric characteristic current-voltage-curve which strongly depends on the current direction. Mainly, diodes are used for faradaic rectification of alternating currents.

Common diodes, in particular with small power, consist of a silicon chip which is pre-passivated at the periphery and has contact between an n- and a p-semiconductor, connections of copper cover wires respectively copper cover head pins and a glass tube which encapsulates the diode and the connection points. The contacting between the chip and the connections is effected by pressure which is maintained by the glass tube.

The term "passivation of electrical components" means, inter alia, the application of a mechanically stable layer onto the final components or their casings. In this case, the passivation protects the component from mechanical damaging and other detrimental influences, such as impurities, and due to the protection in particular further processing can be optimized. Usually, the passivation of the electric components is effected by an application of a glass through dropping or vapour deposition. Therefore, passivation is a mechanical protection of electric components, such as diodes and transistors, and, in addition, helps to stabilise the electrical properties. For example, often, the application of the passivation layer is the final coating step during the production of a semiconductor. In addition, for opto-electric components often a layer having low reflection is applied.

A passivation by glass is generally used for enhancing the quality and the reliability, inter alia, for many kinds of Si-semiconductor components, of bipolar ICs up to faradaic power rectification facilities.

Glass layers which have been melt on (or burned) provide the already above mentioned secure protection of the semiconductor surfaces from mechanical and chemical actions during both, the production and the use. Due to their barrier and partial getter effect, they can also positively influence the electrical function of the components (blocking voltage, blocking currents).

The thermal expansion of silicon is about $3.3 \times 10^{-6}$/K, which is very low. Glasses having similar low thermal expansion have high viscosities and therewith melting temperatures which are so high that they can not be used as passivation glasses. Therefore, for passivation only special glasses with special properties are used. The glasses must have, inter alia, a very good expansion adjustment, a good electrical insulation and a dielectrical break-through resistance.

In most production technologies, the glass passivation is followed by chemical process steps, such as etching of contact windows and electrolytic application of contacts which are associated with an attack on the glass. There are high differences between the chemical stabilities of the passivation glasses and they have to be considered from case to case, when the glass type is selected.

In the prior art, there are known a lot of passivation standard glasses which have proved oneself during practical use.

Zinc borosilicate glasses have the highest sensitivity against the attack of all strong chemicals, such as acids and bases. Therefore, they are only used for vapour deposited contacts—apart from the sinter glass diode technology, wherein during the galvanic tinning of the connection wires also a noticeable removal of glass takes place.

Zero-current nickelization is a special exposure for the passivation glasses. Only lead borosilicate glasses having burning (melting) temperatures of higher than or equal to 700° C. can substantially withstand this procedure.

Normally, the passivation glasses are poor in alkali, since alkali ions, especially at higher temperatures, can diffuse from the glass, for example, into the chip and therewith can affect the functionality, for example of a diode. In addition, the glasses are sodium- and lithium-free, except from conventional impurities.

However, a disadvantage of the known passivation glasses is that they contain a high portion of lead oxide (PbO).

Chemically and electrically stable glasses of the system $PbO—ZnO—SiO_2—Al_2O_3—B_2O_3$ are known from the state of the art [M. Shimbo, K. Furukawa, J. Ceram. Soc. Jpn. Inter. Ed. 96, 1988, p. 201-205] and are used in electronics, inter alia, also for the passivation of diodes. In this case, lead oxide as an ingredient causes an especially high electrical insulation in the glasses.

Since lead oxide is an environmentally harmful ingredient and legislation tends more and more to the prohibition of the use of this substance in electric and electronic apparatuses, there is a need for PbO free glasses which, inter alia, are suitable for the passivation of electric components, such as semiconductor components, as well as for the use in lead-free diodes.

By the simple substitution of one or more other ingredients which are sufficiently available for lead oxide, the economical reproduction of the desired technical glass properties which are influenced by PbO can not be achieved.

SUMMARY OF THE INVENTION

Therefore, it is the object of the present invention to provide electronic components comprising a glass which does not contain lead oxide, but which fulfils the above mentioned requirements.

The object is solved by a method for the production of a glass-coated electronic component, comprising the following steps:

processing a lead-free glass with a liquid to a suspension, wherein the glass contains the following composition (in % by weight);

| | |
|---|---|
| $SiO_2$ | 3-12% |
| $B_2O_3$ | >25-35% |
| $Al_2O_3$ | 0-6% |
| $Cs_2O$ | 0-5% |
| $MgO$ | 0-5% |
| $BaO$ | 0-5% |
| $Bi_2O_3$ | 0-5% |
| $CeO_2$ | 0.1-1% |
| $MoO_3$ | 0-1% |
| $Sb_2O_3$ | 0-2% |
| $ZnO$ | 50-65% | applying the suspension onto a component body;
sintering the component body.

In particular, the object is solved by a method, in which the processed lead-free glass contains the following composition (in % by weight):

| | |
|---|---|
| $SiO_2$ | 4-10% |
| $B_2O_3$ | 27-31% |
| $Al_2O_3$ | 0-4% |
| $Cs_2O$ | 0-4% |
| MgO | 0-4% |
| BaO | 0-4% |
| $Bi_2O_3$ | 0-3% |
| $CeO_2$ | 0.6% |
| $MoO_3$ | 0.5% |
| $Sb_2O_3$ | 0.5% |
| ZnO | 57-62% |

According to preferred embodiments, the content of $B_2O_3$ is in the range of from 24 to 30% by weight. Also preferred are amounts of that compound of 25% by weight or higher than 25% by weight, up to 35% by weight.

A preferred range for the compound $SiO_2$ is from 3 to 11% by weight.

With respect to ZnO, a preferred amount within the glass composition is 55 to 62.5% by weight.

The invention also describes the use of the method according to the present invention for the passivation of electronic components.

Furthermore, the invention discloses electronic components having an applied lead-free glass and the use of the component in electronic parts.

Surprisingly, the lead-free glass to be applied in the method has the technical glass properties which are desired for the passivation of electronic components, without using lead oxide for the production.

The WEEE-instructions say that tinning of glasses has to be effected without lead which results in higher temperatures during tinning. Surprisingly, this requirement is satisfied by the glass according to the present invention.

The lead-free glass is not affected by subsequent purification and processing steps and the electric component is protected from mechanical damaging and other detrimental influences, such as impurities.

Further, the lead-free glass remarkably helps to stabilise the electrical properties of the components. Inter alia, it has a sufficient acid resistance and results in an improvement of the expansion adjustment. Furthermore, the glass according to the present invention is nearly alkali-free and, nevertheless, results in good electrical insulation and dielectrical breakthrough resistance.

For the production of the glasses to be applied in the method according to the present invention, they may be provided as an iron-free glass powder which has been ground to an abrasion-poor condition. Preferably, the glasses are provided in average grain size ranges of between 2.5 to 150 μm. The choice of the grain size range depends on the purpose of the use.

According to a preferred embodiment, at first, the lead-free glass may be ground to a fine powder with a grain size of D50=10 μm, D99=63 μm to D50=8 μm, D99=40 μm and then it may be processed to a suspension, preferably a paste, with a liquid, for example with water. The suspension and/or the liquid for the preparation of the suspension may contain further additives, for example ammonium perchlorate and/or nitric acid. Furthermore, in the suspension and/or in the liquid already before, there may be contained alcohols, in particular polyhydric and long chain ones, or organic binder systems, such as dispersions of acrylate polymerizates in alcohols.

The suspension may be applied onto pre-manufactured electric component bodies. Preferably, the application of the suspension onto the component bodies is effected by an application through dropping of the suspension of the glass powder onto the component body, preferably comprising the contacts, such as Mo- or W-contacts. A hermetically proof glass body around the electric component may be formed by subsequent sintering. In this case, preferably, the sinter temperature is at most 800° C., particularly preferably at most 690° C.

Further, for example, in the case of the passivation of a wafer (glass application onto the Si-disk, prior to the isolation of single components), the glass powder can be applied by spin coating, doctor blading, sedimentation, centrifugation, electrophoresis, dispensing or by screen printing.

In a preferred embodiment of the invention, the suspension of ground glass and liquid and optional additives may be applied onto the component body as drops. In this case, preferably, the component body rotates during the application of the suspension. The component body may be any electric component to be passivated or to be coated, in particular a semiconductor, such as a diode.

Preferably, the glass suspension should wet well the fusion partners, for example metallic lead wires and electrodes and/or chips on Si-basis, so that no cavities are generated during burning and no exfoliation can occur.

In a preferred embodiment, a galvanic tinning or also a dip-tinning of the electric lead wires may follow, wherein the then vitrified electric component may partially contact liquid tin or corrosives.

Within the scope of a good thermal adjustment to the electric lead wires, for example of Kovar (iron-nickel-cobalt alloy) respectively Dumet wires (Cu-cover wires), the electrodes of molybdenum and the chip on the basis of silicon, the thermal expansion of the sintered glass body is approximately 4.2 to $5.0 \times 10^{-6}$ K. In particular, the glass may have expansions in the range of from 4.6 to $4.8 \times 10^{-6}$ K. For the uses as a passivation of a wafer, it is preferable to use a passivation glass having a coefficient of thermal expansion of lower than 4.2 and of higher than 3, to facilitate a better adjustment to silicon. For this purpose, the lead-free passivation glasses of the method according to the present invention may be mixed with an inert, ceramic filler having low or negative thermal expansion.

EXAMPLES

Glasses were melted from conventional raw materials which are substantially free of alkali, except unavoidable impurities, in inductively heated Pt/Rh-crucibles at 1.300° C. The melt was fined at this temperature for one hour, stirred for homogenization for 30 minutes at 1.300 to 1.050° C. and cast to ingots at 1.000° C. For the production of the glass powders, the melt was passed through water-cooled metal rolls and subsequently the glass ribbon was ground.

Table 1 (1a to 1d) shows 15 examples of lead-free glasses which can be applied in the method according to the present invention, with their compositions (based on oxide in percent by weight) and their most important properties:
- the coefficient of thermal expansion 20/300 in ppm/K
- the glass transition temperature Tg in ° C.
- the density in kg/m³
- the temperature at the beginning of the sintering of the glass powder in the gradient furnace in ° C.
- the temperature of the microscopic softening of the glass powder in the gradient furnace in ° C.

the temperature at the end of the sintering of the glass powder in the gradient furnace in ° C.

the temperature at the flattening through flowing of the glass powder in the gradient furnace in ° C.

the temperature at the beginning of the crystallisation of the glass powder in the gradient furnace in ° C.

In this case, the difference of the temperatures between the crystallisation and the flattening through flowing of the glass powder is an important parameter for the evaluation of the passivation glasses and should be as high as possible. On the one hand, the glasses should flatten through flowing at temperatures which are as low as possible, to create the glassy material of the protection layer under mild conditions, and on the other hand, an occurrence of crystallisation during the sintering process, which would negatively affect the properties of the passivation, is not allowed. For the lead-free glasses according to the present invention, this processing range is a little bit smaller than that one of the lead-containing composition, as is shown by a comparison with a glass according to the state of the art ("Comp. A" in table 1d). But for the production of passivations in the demanded quality it is sufficient.

TABLE 1a

|  | Exp. 1 | Exp. 2 | Exp. 3 | Exp. 4 | Exp. 5 |
|---|---|---|---|---|---|
| $SiO_2$ | 10.0 | 7.5 | 10.0 | 6.0 | 10.0 |
| $B_2O_3$ | 27.0 | 27.0 | 27.0 | 27.0 | 24.2 |
| $Al_2O_3$ |  | 2.5 |  |  |  |
| $Cs_2O$ |  |  |  |  | 2.8 |
| MgO |  |  | 4.0 | 4.0 |  |
| BaO |  |  |  |  |  |
| ZnO | 61.8 | 61.8 | 57.8 | 61.8 | 61.8 |
| PbO |  |  |  |  |  |
| $Bi_2O_3$ |  |  |  |  |  |
| $CeO_2$ | 0.6 | 0.6 | 0.6 | 0.6 | 0.6 |
| $Sb_2O_3$ | 0.5 | 0.5 | 0.5 | 0.5 | 0.5 |
| $MoO_3$ | 0.5 | 0.5 | 0.5 | 0.5 |  |
| $\alpha_{20/300}$ [ppm/K] | 4.4 | 4.53 | 4.76 | 4.92 | 4.48 |
| Tg [° C.] | 543 | 542 | 562 | 541 | 554 |
| Density [kg/m³] | 3564 | 3593 | 3496 | 3667 | 3457 |
| Beginning of sintering [° C.] | 591 | 590 | 596 | 587 | 594 |
| Microscopic softening [° C.] | 608 | 605 | 612 | 594 | 602 |
| After the completion of sintering [° C.] | 623 | 618 | 628 | 605 | 615 |
| Flattening through flowing [° C.] | 685 | 682 | 689 | 660 | 683 |
| Crystallisation [° C.] | 709 | 705 | 727 | 678 | 704 |
| Difference between crystallisation and flattening through flowing [° C.] | 24 | 23 | 38 | 18 | 21 |

TABLE 1b

|  | Exp. 6 | Exp. 7 | Exp. 8 | Exp. 9 | Exp. 10 |
|---|---|---|---|---|---|
| $SiO_2$ | 6.0 | 4.0 | 5.0 | 4.0 | 10.0 |
| $B_2O_3$ | 27.1 | 27.1 | 29.1 | 30.1 | 24.3 |
| $Al_2O_3$ | 4.0 | 4.0 | 3.0 | 3.0 |  |
| $Cs_2O$ |  |  |  |  |  |
| MgO |  |  | 2.0 | 2.0 |  |
| BaO |  | 4.0 |  | 2.0 |  |
| ZnO | 61.8 | 59.8 | 59.8 | 57.8 | 61.8 |
| PbO |  |  |  |  |  |
| $Bi_2O_3$ |  |  |  |  | 2.8 |
| $CeO_2$ | 0.6 | 0.6 | 0.6 | 0.6 | 0.6 |
| $Sb_2O_3$ | 0.5 | 0.5 | 0.5 | 0.5 | 0.5 |
| $MoO_3$ |  |  |  |  |  |
| $\alpha_{20/300}$ [ppm/K] | 4.5 | 4.88 | 4.74 | 4.92 | 4.47 |
| Tg [° C.] | 548 | 531 | 545 | 545 | 543 |
| Density [kg/m³] | 3733 | 3803 | 3677 | 3674 | 3834 |
| Beginning of sintering [° C.] |  | 565 | 577 | 574 | 574 |
| Microscopic softening [° C.] |  | 580 | 601 | 592 | 585 |
| After the completion of sintering [° C.] | 633 | 610 | 632 | 604 | 602 |
| Flattening through flowing [° C.] | 674 | 742 | 667 | 663 | 689 |
| Crystallisation [° C.] | 683 | 648 | 685 | 681 | 702 |
| Difference between crystallisation and flattening through flowing [° C.] | 9 | −94 | 18 | 18 | 13 |

TABLE 1c

|  | Exp. 11 | Exp. 12 | Exp. 13 | Exp. 14 |
|---|---|---|---|---|
| $SiO_2$ | 5.0 | 5.0 | 5.0 | 5.0 |
| $B_2O_3$ | 29.1 | 29.1 | 29.1 | 29.1 |
| $Al_2O_3$ | 4.0 | 4.0 | 2.5 | 4.0 |
| $Cs_2O$ |  |  |  |  |
| MgO | 2.5 | 1.5 | 2.5 | 0.5 |
| BaO |  |  |  |  |
| ZnO | 58.3 | 59.3 | 60.3 | 60.3 |
| PbO |  |  |  |  |
| $Bi_2O_3$ |  |  |  |  |
| $CeO_2$ | 0.6 | 0.6 | 0.6 | 0.6 |
| $Sb_2O_3$ | 0.5 | 0.5 |  | 0.5 |
| $MoO_3$ |  |  |  |  |
| $\alpha_{20/300}$ [ppm/K] | 4.82 | 4.73 | 4.79 | 4.65 |
| Tg [° C.] | 548 | 547 | 542 | 549 |
| Density [kg/m³] | 3637 | 3661 | 3673 | 3648 |
| Beginning of sintering [° C.] | 583 | 592 | 585 | 573 |
| Microscopic softening [° C.] | 602 | 604 | 602 | 611 |
| After the completion of sintering [° C.] | 642 | 647 | 644 | 629 |
| Flattening through flowing [° C.] | 688 | 682 | 690 | 680 |
| Crystallisation [° C.] | 702 | 703 | 701 | 693 |
| Difference between crystallisation and flattening through flowing [° C.] | 14 | 21 | 11 | 13 |

TABLE 1d

|  | Exp. 15 | Comp. A* |
|---|---|---|
| $SiO_2$ | 5.0 | 36.8 |
| $B_2O_3$ | 29.1 | 13.1 |
| $Al_2O_3$ | 4.0 | 2.9 |
| $Cs_2O$ |  |  |
| MgO | 1.0 |  |
| BaO |  |  |
| ZnO | 59.8 |  |
| PbO |  | 47.2 |
| $Bi_2O_3$ |  |  |
| $CeO_2$ | 0.6 |  |
| $Sb_2O_3$ | 0.5 |  |
| $MoO_3$ |  |  |
| $\alpha_{20/300}$ [ppm/K] | 4.67 | 4.8 |
| Tg [° C.] | 542 | 460 |
| Density [kg/m³] | 3638 | 3483 |
| Beginning of sintering [° C.] | 573 | 532 |
| Microscopic softening [° C.] | 607 | 571 |
| After the completion of sintering [° C.] | 623 | 620 |
| Flattening through flowing [° C.] | 678 | 695 |
| Crystallisation [° C.] | 694 | 710 |
| Difference between crystallisation and flattening through flowing [° C.] | 16 |  |

*prior art

The invention claimed is:

1. A method of producing a glass-coated electronic component, comprising the following steps:
   i. processing a lead-free glass with a liquid to a suspension, wherein the glass has a composition (in % by weight) comprising:

| | |
   |---|---|
   | $SiO_2$ | 3-12% |
   | $B_2O_3$ | 24-35% |
   | $Al_2O_3$ | 0-6% |
   | $Cs_2O$ | 0-5% |
   | MgO | 0-5% |
   | BaO | 0-5% |
   | $Bi_2O_3$ | 0-5% |
   | $CeO_2$ | 0.1-1% |
   | $MoO_3$ | 0-1% |
   | $Sb_2O_3$ | 0-2% |
   | ZnO | 50-65%; | ii. applying the suspension onto a component body;
   iii. sintering the component body.

2. The method according to claim 1, wherein the composition (in % by weight) comprises:

| | |
   |---|---|
   | $SiO_2$ | 4-10% |
   | $B_2O_3$ | 27-31% |
   | $Al_2O_3$ | 0-4% |
   | $Cs_2O$ | 0-4% |
   | MgO | 0-4% |
   | BaO | 0-4% |
   | $Bi_2O_3$ | 0-3% |
   | $CeO_2$ | 0.6% |
   | $MoO_3$ | 0.5% |
   | $Sb_2O_3$ | 0.5% |
   | ZnO | 57-62%. |

3. The method according to claim 1, wherein the glass processed into said suspension is in the form of a ground glass powder.

4. The method according to claim 3, wherein the glass powder is iron-free and in an abrasion-poor condition.

5. The method according to claim 3, wherein the glass powder has an average grain size range of between 2.5 to 150 µm.

6. The method according to claim 3, wherein the glass is at first ground to a fine powder having a grain size of D50=10 µm, D99=63 µm to D50=8 µm, D99=40 µm.

7. The method according to claim 1, wherein the liquid is water.

8. The method according to claim 1, wherein the suspension contains at least one additive.

9. The method according to claim 8, wherein the at least one additive is ammonium perchlorate and/or nitric acid.

10. The method according to claim 1, wherein the suspension contains alcohols and/or organic binder systems.

11. The method according to claim 1, wherein the suspension is dropped onto a component body.

12. The method according to claim 1, wherein the electronic component is a semiconductor component.

13. The method according to claim 12, wherein the semiconductor component is a diode.

14. The method according to claim 1, wherein the sintering is performed at a sintering temperature of at most 680° C.

15. The method according to claim 1, wherein the suspension completely covers fusion partners on the component body so that during burning no cavities are generated and/or no exfoliation occurs.

16. The method according to claim 1, wherein a galvanic tinning or dip-tinning of electric lead wires of the electronic component follows the sintering.

17. An electronic component having an applied lead-free glass layer, wherein the glass layer comprises the following composition (in % by weight):

| | |
   |---|---|
   | $SiO_2$ | 3-12% |
   | $B_2O_3$ | 24-35% |
   | $Al_2O_3$ | 0-6% |
   | $Cs_2O$ | 0-5% |
   | MgO | 0-5% |
   | BaO | 0-5% |
   | $Bi_2O_3$ | 0-5% |
   | $CeO_2$ | 0.1-1% |
   | $MoO_3$ | 0-1% |
   | $Sb_2O_3$ | 0-2% |
   | ZnO | 50-65%. |

18. The electronic component according to claim 17, wherein the glass layer comprises the following composition (in % by weight):

| | |
   |---|---|
   | $SiO_2$ | 4-10% |
   | $B_2O_3$ | 27-31% |
   | $Al_2O_3$ | 0-4% |
   | $Cs_2O$ | 0-4% |
   | MgO | 0-4% |
   | BaO | 0-4% |
   | $Bi_2O_3$ | 0-3% |
   | $CeO_2$ | 0.6% |
   | $MoO_3$ | 0.5% |
   | $Sb_2O_3$ | 0.5% |
   | ZnO | 57-62%. |

19. The electronic component according to claim 17, consisting of a semiconductor component with the lead-free glass layer applied thereto.

20. The electronic component according to claim 19, wherein the semiconductor component is a diode.

21. The method according to claim 10, wherein said alcohols are polyhydric and long chain and wherein said organic binder systems are alcoholic dispersions of acrylate polymerizates.

22. A method of passivating an electronic component, said method comprising the steps of:
   a) processing a glass powder with a liquid to form a suspension, wherein the glass powder is free of lead and has a composition, in percent by weight:

| | |
   |---|---|
   | $SiO_2$ | 3-12% |
   | $B_2O_3$ | 24-35% |
   | $Al_2O_3$ | 0-6% |
   | $Cs_2O$ | 0-5% |
   | MgO | 0-5% |
   | BaO | 0-5% |
   | $Bi_2O_3$ | 0-5% |
   | $CeO_2$ | 0.1-1% |
   | $MoO_3$ | 0-1% |
   | $Sb_2O_3$ | 0-2% |
   | ZnO | 50-65%. | b) applying the suspension onto a component body of the electronic component; and c) sintering the component body with the suspension applied there on in step b) to form a hermetically sealed lead-free glass layer around the electronic component so as to passivate the electronic component.

23. The method according to claim 22, wherein the liquid is water and the glass powder has a grain size range of 2.5 to 150 μm.

24. The method according to claim 22, wherein the sintering is performed at a sintering temperature of at most 680° C.

25. The method according to claim 23, wherein the electronic component is a diode and said lead-free glass layer encloses the diode.

* * * * *